(12) United States Patent
Arisa et al.

(10) Patent No.: US 8,152,597 B2
(45) Date of Patent: Apr. 10, 2012

(54) WAFER GRINDING METHOD AND WAFER GRINDING MACHINE

(75) Inventors: Shigeharu Arisa, Tokyo (JP); Toshiyuki Ozawa, Tokyo (JP)

(73) Assignee: Tokyo Seimitsu Co., Ltd., Mitaka-shi (JP)

( * ) Notice: Subject to any disclaimer, the term of this patent is extended or adjusted under 35 U.S.C. 154(b) by 527 days.

(21) Appl. No.: 12/398,081

(22) Filed: Mar. 4, 2009

(65) Prior Publication Data
US 2009/0247052 A1 Oct. 1, 2009

(30) Foreign Application Priority Data

Mar. 27, 2008 (JP) ................................. 2008-084565

(51) Int. Cl.
*B24B 1/00* (2006.01)
*B24B 49/00* (2012.01)
(52) U.S. Cl. ................ 451/8; 451/41; 451/290
(58) Field of Classification Search .................. 451/5, 8, 451/41, 285–290
See application file for complete search history.

(56) References Cited

U.S. PATENT DOCUMENTS

| | | | | |
|---|---|---|---|---|
| 5,816,895 | A * | 10/1998 | Honda | 451/41 |
| 6,368,881 | B1 * | 4/2002 | Brouillette et al. | 438/7 |
| 6,572,444 | B1 * | 6/2003 | Ball et al. | 451/10 |
| 6,887,126 | B2 * | 5/2005 | Brouillette et al. | 451/6 |
| 7,500,902 | B2 * | 3/2009 | Nomiya | 451/8 |
| 7,601,615 | B2 * | 10/2009 | Hayashi et al. | 438/459 |
| 2002/0005958 | A1 * | 1/2002 | Sekiya | 356/631 |
| 2002/0081954 | A1 * | 6/2002 | Mori et al. | 451/65 |
| 2007/0105343 | A1 * | 5/2007 | Hayashi et al. | 438/459 |
| 2009/0239448 | A1 * | 9/2009 | Nedu | 451/5 |

FOREIGN PATENT DOCUMENTS

| | | |
|---|---|---|
| DE | 600 01 204 T2 | 11/2003 |
| EP | 1 086 308 B1 | 1/2003 |
| EP | 1 779 969 A1 | 5/2007 |
| EP | 1 868 231 A1 | 12/2007 |
| JP | 2006-021264 | 1/2006 |
| JP | 2006-222467 | 8/2006 |
| JP | 2007-113980 | 5/2007 |
| JP | 2007-335458 | 12/2007 |

OTHER PUBLICATIONS

SIPO Search Report dated Apr. 1, 2009, for corresponding Singapore application 200808155-6, noting listed references in this IDS.
Office action issued on Mar. 1, 2010 in corresponding German Patent Application No. 102008063721.1-43, 3pp.
Office action issued on Aug. 17, 2010 in corresponding Korean Patent Application No. 109573/2008, including English translation, 8pp.

* cited by examiner

*Primary Examiner* — Maurina Rachuba
(74) *Attorney, Agent, or Firm* — Christie, Parker & Hale LLP.

(57) ABSTRACT

A wafer grinding method and a wafer grinding machine are disclosed for grinding a wafer by executing both the rough grinding process and the finish grinding process. After the rough grinding process before the finish grinding process, the wafer thickness is measured with a noncontact-type thickness gauge, and during the finish grinding process, the finish thickness is finely adjusted by use of a contact-type thickness gauge and referring to the measurement data of the noncontact-type thickness gauge.

2 Claims, 2 Drawing Sheets

WAFER GRINDING METHOD AND WAFER GRINDING MACHINE

CROSS-REFERENCE TO RELATED APPLICATION

This application claims priority of Japanese Patent Application Number 2008-084565, filed on Mar. 27, 2008.

BACKGROUND OF THE INVENTION

1. Technical Field of the Invention

This invention relates to a wafer grinding method and a wafer grinding machine.

2. Description of the Related Art

With the ever-increasing trend toward higher integration and packaging of semiconductor devices in recent years, semiconductor chips (dies) have been correspondingly reduced in thickness. As a result, the back surface of the wafer is ground by a grinding means before dicing. The surface of the wafer back is ground with a protective tape attached to the front surface of the wafer to protect the circuit pattern formed on the front surface of the wafer.

Further, it common practice to polish the back surface of the water that has been ground to remove distortion.

With the reduction in wafer thickness, the finish thickness of the wafer requires high dimensional accuracy. Since the finish thickness of the wafer is normally considered to include the protective film; however the thickness variation of the wafer directly affects the finish thickness of the wafer.

In view of this, Japanese Unexamined Patent Publication No. 2007-335458 employs the means described below in order to secure the wafer having a target thickness, by accurately measuring the thickness of only the wafer, excluding the protective tape free of the effect of the nitride or the oxide on the back surface of the wafer.

Specifically, according to Japanese Unexamined Patent Publication No. 2007-335458, the back surface of the wafer is ground by measuring the total wafer thickness including the protective tape using a contact-type thickness gauge during the rough grinding process and by measuring the thickness of only the wafer using a noncontact-type thickness gauge during the finish grinding process. Once the target finish thickness is reached, the grinding process is ended thereby achieving an accurate target finish thickness.

A noncontact-type thickness gauge is described, for example, in Japanese Unexamined Patent Publication No. 2007-113980.

According to Japanese Unexamined Patent Publication No. 2007-113980, a hollow cylindrical probe for an eddy current displacement gauge is mounted on the bottom surface of the gauge body, and a coil is arranged at the forward end of the probe. On the bottom surface, a laser radiation unit and a laser light receiving unit of the laser displacement gauge are also arranged on the inside of the hollow cylindrical probe.

An AC magnetic field is generated by the coil and an eddy current is induced to a metal plate. The inductance change of the coil due to the eddy current thus induced is detected to calculate the distance L2 from the probe to the metal plate.

On the other hand, a laser beam is radiated from the laser radiation unit, and the laser beam reflected on the surface of the coating is detected by a laser receiving unit. The distance L1 between the laser displacement gauge and the coating surface is calculated according to trigonometry. The thickness of the coating is calculated based on distances L1 and L2.

During the grinding process; however the environment of the ground surface of the wafer is not stabilized due to the grinding liquid and the grinding sludge, and the use of the noncontact-type thickness gauge during the finish grinding process as described in Japanese Unexamined Patent Publication No. 2007-335458 would make a stable measurement difficult while at the same time fouling the measuring instrument. A measurement conducted while the work is not machined would be affected by the oxide film or the nitride film formed on the back surface of the water, thereby often making it impossible to measure the wafer thickness accurately.

SUMMARY OF THE INVENTION

This invention has been proposed to obviate the problems described above, and the object thereof is to provide a wafer grinding machine in which a noncontact-type thickness gauge is used for measurement after the rough grinding process before the final finish grinding process, so that the only the wafer thickness can be stably measured free of the effect of the grinding liquid and the grinding sludge, thereby making it possible to secure a wafer of the target thickness positively.

In order to solve the problems described above, according to a first aspect of the invention, there is provided a wafer grinding method for grinding the back surface of a semiconductor wafer through the rough grinding process and the finish grinding process before dicing, wherein the wafer thickness is actually measured with a noncontact-type thickness gauge after the rough grinding process before the finish grinding process.

As a result, the wafer thickness can be actually measured with the noncontact-type thickness gauge without being affected by the grinding liquid or the grinding sludge in stable state not during the grinding process.

According to a second aspect of the invention, there is provided a wafer grinding method, wherein during the finish grinding process, the wafer thickness is actually measured using the contact-type thickness gauge and the finish thickness is finely adjusted based on the actual measurement data obtained before the finish grinding process by the noncontact-type thickness gauge.

In view of the fact that the thickness of only the wafer is actually measured with the noncontact-type thickness gauge before the finish grinding process, the wafer can be machined to the target thickness with high accuracy free of the effect of the protective tape using the contact-type thickness gauge such as the in-process gauge during the finish grinding process.

According to a third aspect of the invention, there is provided a wafer grinding machine comprising a grinding means for holding and grinding a wafer and a feed means for feeding the grinding means while grinding the wafer, a noncontact-type thickness gauge for measuring the wafer thickness before the finish grinding process after the rough grinding process with the grinding means pushed toward the wafer held, a contact-type thickness gauge for measuring the wafer thickness during the finish grinding process, and a control unit for measuring the wafer thickness appropriately with the contact-type thickness gauge while at the same time making the fine adjustment of the finish thickness by reference to the measurement data of the noncontact-type thickness gauge.

In this way, the noncontact-type thickness gauge is used after the rough grinding process, and therefore, the wafer thickness can be actually measured in stable state without being affected by the grinding liquid or the grinding sludge.

Since the thickness of only the wafer is measured before the finish grinding process, the wafer can be ground to the target thickness with high accuracy without being affected by the protective tape even with the contact-type thickness gauge during the finish grinding process.

The present invention may be more fully understood from the description of preferred embodiments of the invention, as set forth below, together with the accompanying drawings.

DESCRIPTION OF THE PREFERRED EMBODIMENTS

Figure 1:
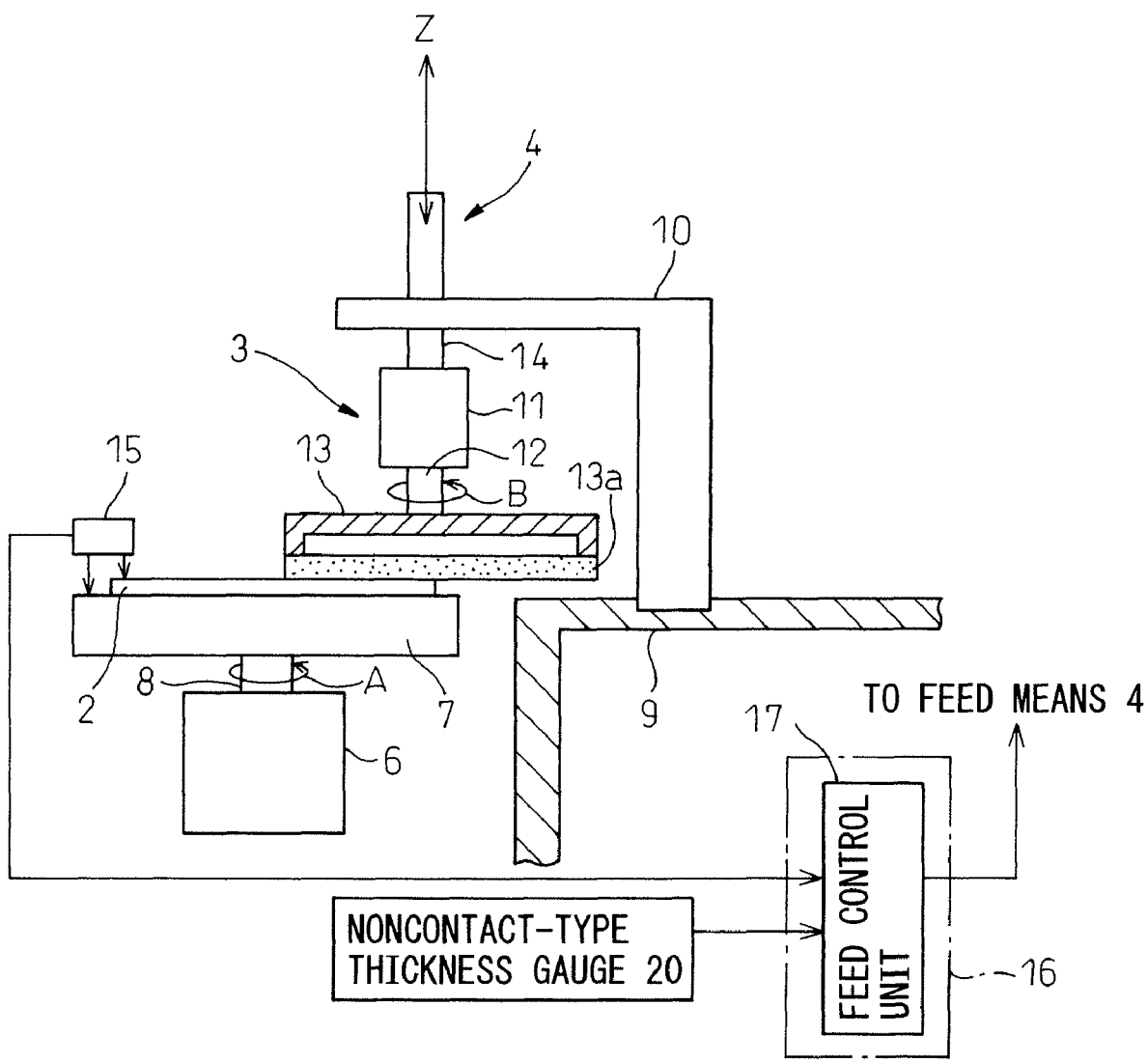
FIG. 1 is a diagram showing a system configuration of the essential parts showing an example of the wafer grinding machine for carrying out the finish grinding process of all the semiconductor wafer grinding processes according to this invention.

FIG. 1 shows an example of a semiconductor wafer grinding machine 1 used for grinding a semiconductor wafer. This semiconductor wafer grinding machine 1 (hereinafter referred to as the grinding machine 1) includes a holding means (described later) for holding a semiconductor wafer 2 (hereinafter referred to as the wafer 2), a grinding means 3 for grinding the wafer 2 and a feed means 4 for grind-feeding the grinding means 3.

Incidentally, the grinding process of the wafer 2 employs a machining method for executing the rough grinding process and the finish grinding process, and the grinding machine 1 is used for carrying out the finish grinding process after the rough grinding process executed in a grinding machine (not shown) as a preceding process.

Figure 2:
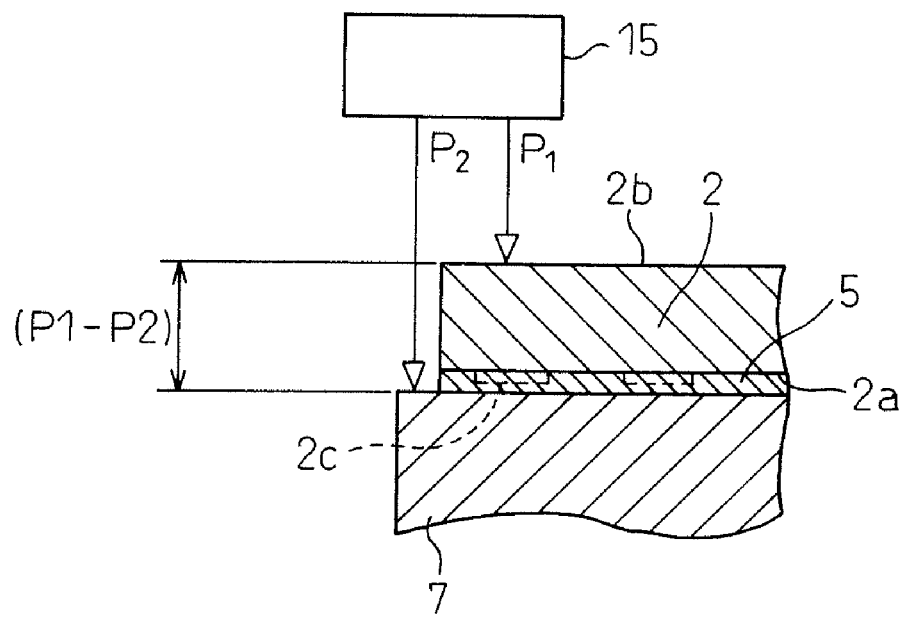
FIG. 2 is an enlarged sectional view of the essential parts explaining an example of a wafer to be ground in FIG. 1 and a technique for actually measuring the thickness thereof.

The wafer 2, as shown in FIG. 2, is configured of a protective film 5 attached on the surface 2a formed with a circuit pattern 2c, for example. Incidentally, the wafer 2 may alternatively be so configured that the protective film 5 is attached on the surface 2a formed with the circuit pattern 2c and a support base member (not shown) is further attached thereon.

Wafer 2 is held by a holding means constituting, for example, an adsorption plate (chuck), not shown, on the upper surface of a turn table 7 rotated by a motor 6. Incidentally, the turn table 7 is formed in the shape of a disk, and on the lower surface thereof, the output shaft 8 of the motor 6 is mounted on the same axis as the center axis of the turn table 7. This turn table 7 is rotated along the direction of arrow A by the drive force of the motor 6.

The thickness of this wafer 2 is measured by a means described later. Before the finish grinding process, for example, the thickness of the wafer 2 is about 750 μm and the thickness of the protective film 5 is about 100 μm.

The grinding means 3 described later is pushed in by the feed means 4 while being brought into contact with the back surface 2b constituting the surface of the wafer 2 to be ground, so that the wafer 2 is ground to a predetermined small thickness of about 30 μm.

The grinding means 3 is arranged at the forward end of a substantially L-shaped ram 10 erected on the machine body 9 and mounted on the feed means 4 reciprocable in the direction Z.

Specifically, the grinding means 3 has a grinding stone 13 mounted at the forward of the output shaft 12 of the motor 11 moved in axial direction by the shaft portion (described later) making up the feed means 4. In the process, the output shaft 12 of the motor 11 is mounted on the same axis as the center axis of the grinding stone 13 on the upper surface of the grinding stone 13, and rotated in the direction of arrow B by the drive force of the motor 11.

The grinding stone 13 is for grinding the back surface 2b of the wafer 2 held by adsorption on the turn table 7, and formed of, for example, a diamond with a liquid bonding agent as a coupling material. Due to the use of the liquid bonding agent as a coupling material, the grinding stone acquires elasticity, and the shock is relaxed when the grinding stone 13 and the wafer 2 come into contact with each other. Thus, the back surface 2b of the wafer 2 can be machined to high accuracy. The grinding stone 13 has the stone part 13a in opposed relation to the back surface 2b of the wafer 2 held by adsorption on the turn table 7.

Next, the feed means 4 for grind-feeding the grinding means 3 includes a ball screw 14, etc. The ball screw 14 is driven by a motor (not shown) through a feed control unit (described later). Then, the grinding stone 13 can be moved in the direction Z with respect to the wafer 2. By feeding the grinding stone 13 in pressure contact with the back surface 2b of the wafer 2, therefore, the back surface 2b of the wafer 2 can be ground with the grinding stone 13.

The ball screw 14 is fixed on an L-shaped ram 10. The ram 10 of the grinding machine 1, though of fixed type, may alternatively be of movable type.

The grinding machine 1 for finish grinding which is configured as described above includes a detection means 15 as a control system such as a power controller for detecting, in real time, the thickness of the wafer 2 held by adsorption on the turn table 7 during the finish grinding process to measure the thickness of the wafer 2. An example of the detection means 15 is a contact-type thickness gauge such as an in-process gauge.

The in-process gauge is what is called a touch sensor of contact type. The change in the probe constituting a contactor is converted into a voltage signal by a differential transformer, and based on the voltage signal thus converted, the distance between the upper surface of the turn table 7 and the back surface 2b of the wafer 2 (P1-P2), i.e. the thickness of the wafer 2 and the protective film 5 are measured in real time.

The control system of the grinding machine 1 includes a control unit 16 in which a signal associated with the actual measurement (P1-P2) is appropriately retrieved from the detection means 15 for measuring the thickness of the wafer 2 by the feed control unit 17 to control the motor of the feed means 4. Then, with reference to the measurement data of the noncontact-type thickness gauge 20 (see FIG. 3), the control signal is applied to the motor of the feed means 4 for fine adjustment of the finish thickness of the wafer 2. Incidentally, an example of the noncontact-type thickness gauge 20 may be an IR (infrared ray) sensor in which, taking advantage of the property of the infrared light transmitting through metals and plastics, the reflection time of the infrared light reflected on the boundary surface between the wafer 2 and the protect 5 is measured thereby to measure the thickness of the wafer as a unit.

With regard to the grinding machine 1 configured as described above, the process of grinding and judging the grinding quality at the time of the grinding operation are explained below.

First, the wafer 2 is set on the grinding machine (not shown) for rough grinding and thus ground roughly. During the rough grinding process, the wafer thickness is measured in real time by another detection means having a similar configuration to the detection means 15 of the grinding machine 1 for finish grinding.

Figure 3:
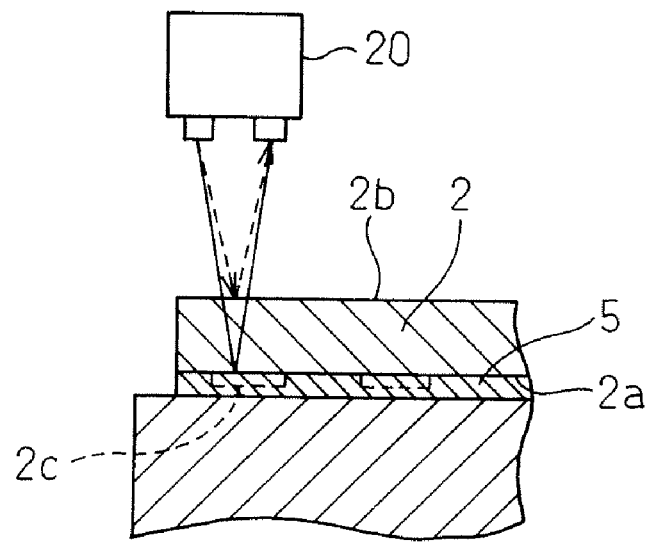
FIG. 3 is an enlarged sectional view of the essential parts explaining a technique for actually measuring the wafer thickness with a noncontact-type thickness gauge after the rough grinding process.

In this rough grinding process, the grinding liquid used and the grinding sludge generated are removed from the ground surface of the wafer 2, after which the thickness of the wafer 2 is measured using the noncontact-type thickness gauge 20 (FIG. 3). The resulting measurement data is sent out to the control unit 16 of the grinding machine 1 for finish grinding described later.

As described above, in the grinding machine for rough grinding, the thickness of the wafer 2 is measured after the rough grinding process, and therefore, can be accurately measured with the noncontact-type thickness gauge 20 free of the effect of the grinding liquid or the grinding sludge.

Since the accurate thickness of the wafer 2 can be grasped after the rough grinding process in this way, the wafer 2 can be ground to the target thickness by the grinding machine 1 for finish grinding.

After the rough grinding process, the wafer 2 is held on the upper surface of the turn table 7 of the finish grinding machine 1 with the protective film 5 attached on the surface 2a of the wafer 2 and directed down as shown in FIG. 1.

Next, the wafer 2 is rotated by the motor 6 on the one hand and the grinding stone 13 of the grinding means 3 mounted on the feed means 4 at the forward end of the ram 10 is rotated by the motor 11 on the other hand. Then, power is supplied to the motor 11 in response to a control command issued from the feed control unit 17, so that the ball screw 14 is driven and the grinding stone 13 is moved down.

With the stone portion 13a of the grinding stone 13 brought into contact with the back surface 2b of the wafer 2, the grinding stone 13 is moved down by a predetermined cut amount for each rotation of the turn table 7 thereby to perform the finish grinding process.

During the finish grinding process described above, the thickness of the wafer 2 held by adsorption on the turn table 7 is measured in real time with the in-process gauge as the detection means 15 appropriately retrieving a signal associated with the distance (P1-P2) between the upper surface of the turn table 7 and the back surface 2b of the wafer 2. This signal associated with the distance (P1-P2) is sent to the feed control unit 17 for controlling the motor of the feed means 4 of the control unit 16.

The feed control unit 17 is supplied with the measurement data on the thickness of the wafer 2 measured using the noncontact-type thickness gauge 20 after the rough grinding process.

As a result, the feed control unit 17 sends out the control signal to the motor of the feed means 4 to perform the fine adjustment of the finish thickness of the wafer 2 based on the thickness measurement data of the wafer 2 obtained using the noncontact-type thickness gauge 20 and the distance (P1-P2) between the upper surface of the turn table 7 and the back surface 2b of the wafer 2 as measured by the in-process gauge appropriately with the progress of the finish grinding process, thereby making possible the finish grinding to the target thickness of the wafer 2.

Upon normal completion of the grinding process on the back surface 2b in the manner described above, the grinding stone 13 is moved back from the wafer 2 and the motor 11 is stopped to stop the rotation of the grinding stone 13. Thus, the grinding process by the grinding machine 1 is ended.

After the grinding process, the polishing process is executed by a polishing machine, not shown, with the wafer 2 kept fixed on the turn table 7 thereby to remove the damaged layer, etc. As a result, the breakage such as an undue cracking of the wafer 2 is prevented. The wafer 2 thus completely ground is removed from the turn table 7 and transferred to the next step such as the wafer processing step for coating and dicing.

As described above, in the grinding process for the wafer 2 according to this embodiment, the rough grinding process is executed first, and after that, the thickness of the wafer 2 is measured by the noncontact-type thickness gauge 20, followed by the final finish grinding process. The ground surface of the wafer 2, therefore, unlike during the grinding process, is not affected by the grinding liquid used or the grinding sludge generated. Thus, the thickness of the wafer 2 alone can be accurately measured with the noncontact-type thickness gauge 20.

In spite of the fact that the contact-type in-process gauge is used during the finish grinding process, the use of the noncontact-type thickness gauge 20 to measure the thickness of only the wafer 2 before the finish grinding process makes it possible to grind the wafer 2 to the target thickness with high accuracy free of the effect of the protective tape.

Incidentally, the noncontact-type thickness gauge 20 can be protected from being fouled or a fault by isolation from the environmental contamination during the grinding process.

This invention is not limited to the embodiments described above. Instead of the in-process gauge used as the detection means 15, for example, any other measuring means capable of measuring the back surface position of the wafer 2 fixed on the turn table 7 may be used with equal effect.

Further, the thickness, though measured by the noncontact-type thickness gauge 20 on the rough grinding shaft after the rough grinding process in the embodiment described above, may alternatively be measured on the finish grinding shaft before the finish grinding process with equal effect.

While the invention has been described by reference to specific embodiments chosen for purposes of illustration, it should be apparent, to those skilled in the art, that numerous modifications could be made thereto without departing from the basic concept and scope of the invention.

The invention claimed is:

1. A wafer grinding method for grinding a back surface of a wafer by executing a rough grinding process and a finish grinding process before dicing, the method comprising:
    measuring a thickness of the wafer with a noncontact-type thickness gauge, before the finish grinding process and after the rough grinding process;
    during the finish grinding process, measuring the thickness of the wafer with the contact-type thickness gauge; and
    at substantially the same time as the measuring the thickness of the wafer with a contact-type thickness gauge, making fine adjustment to the finished thickness, based on the measurement data obtained from the noncontact-type thickness gauge, before the finish grinding process.

2. A wafer grinding machine comprising:
    a grinding unit for holding and grinding a wafer;
    a feed unit for feeding the grinding unit for grinding operation;
    a noncontact-type thickness gauge for measuring the thickness of the wafer before a finish grinding process after a rough grinding process executed by pushing in the grinding unit toward the wafer using the feed unit;
    a contact-type thickness gauge for measuring the thickness of the wafer during the finish grinding process; and
    a control unit for measuring the wafer thickness appropriately with the contact-type thickness gauge, while at a substantially same time, making fine adjustment of the finish thickness based on the measurement data from the noncontact-type thickness gauge during the finish grinding process.

* * * * *